United States Patent [19]

Ijaz et al.

[11] 4,398,055

[45] Aug. 9, 1983

[54] RADIANT ENERGY CONVERTER HAVING SPUTTERED CDSIAS2 ABSORBER

[76] Inventors: Lubna R. Ijaz; Larry C. Burton, both of P.O. Box 158, Christiansburg, Va. 24073

[21] Appl. No.: 295,072

[22] Filed: Aug. 21, 1981

[51] Int. Cl.³ .................... H01L 31/06; H01L 31/18; C23C 15/00

[52] U.S. Cl. .................................. 136/258; 136/260; 136/261; 204/192 S; 204/192 P; 357/30; 357/59; 427/74; 29/572

[58] Field of Search ...................... 204/192 S, 192 P; 136/258 PC, 260, 261; 357/30, 59; 427/74, 86; 29/572

[56] References Cited

PUBLICATIONS

N. K. Annamalai, "CdS-Sputtered Cu₂S Solar Cells", Conf. Record, 12th IEEE Photovoltaic Specialists Conf., (1976), pp. 547–548.

W. W. Anderson et al., "Magnetron Reactive Sputtering Deposition of Cu₂S/CdS Solar Cells", Proceedings, 2nd European Community Photovoltaic Solar Energy Conf., (1979), Reidel Publishing Co., pp. 890–897.

J. Piekoszewski et al., "RF-Sputtered CuInSe₂ Thin Films", Solar Energy Materials, vol. 2, pp. 363–372, (1980).

J. E. Greene et al., "Epitaxial Growth of $In_{1-x}Ga_xSb$ Thin Films by Multitarget, RF Sputtering", J. Appl. Phys., vol. 47, pp. 2289–2297, (1976).

A. F. Carroll et al., "Compositional Studies Related to Sputtered Cd-Si-As Films", J. Electrochem. Soc., vol. 128, pp. 1769–1773, (1981).

L. C. Burton et al., "Studies of $CdSiAs_2$ for Photovoltaic Applications", Proceedings 1979 Southeastern Conf., (Roanoke, Va.), pp. 25–28.

Primary Examiner—Aaron Weisstuch
Attorney, Agent, or Firm—Jim Zeeger

[57] ABSTRACT

Thin film radiant energy converter having a sputtered $CdSiAs_2$ photovoltaic absorber layer and a thermally evaporated CdS top layer. The sputtering technique with multiple targets (Cd, Si, As) is used to obtain stoichiometric $CdSiAs_2$ thin films which are polycrystalline and have large grain size to thereby reduce grain boundary recombinations of the photogenerated electrons.

13 Claims, 2 Drawing Figures

RADIANT ENERGY CONVERTER HAVING SPUTTERED CDSIAS$_2$ ABSORBER

BACKGROUND ART

Thin film polycrystalline radiant energy converters are well known in the art as exemplified by the following references:
(1) *IEEE Spectrum*—February 1980, "Photovoltaics" pages 26–41
(2) *Electro-Optical Systems Design*, "Solar Cells" pages 39–49
(3) *Sov. Phys. Semicond.*—Vol. 10, No. 9, September 1976, "Photoelectric Properties and Potential Practical Applications of CdSiAs$_2$ Homojunction Diodes"
(4) U.S. Pat. No. 4,251,286—Barnett

SUMMARY OF INVENTION

According to the present invention, a thin film radiant energy converter incorporates a stoichiometrically sputtered polycrystalline CdSiAs$_2$ photovoltaic absorber layer upon which is applied a CdS top layer to form a heterojunction. In forming the CdSiAs$_2$ material by sputtering, close control of the sputtering parameters (bias voltage, target and substrate temperature ranges, etc) assures stoichiometry (Cd-25%, Si-25% and As$_2$-50%) and large grain size to thereby reduce grain boundary recombination of photogenerated electrons and thus improve the efficiency of solar energy conversion.

In the preferred embodiment, the CdSiAs$_2$ layer is sputtered directly upon the surface of a conductive substrate, such as the exposed surface of a molybdenum or other conductive film formed on a non-conductive support substrate such as glass. The cell is completed by securing a copper wire cathode via an indium solder contact to the CdS top layer. These cells are very efficient, have improved current and voltage characteristics, use cheaper materials (relative to single crystal Si and GaAs cells) and less sophisticated technology, and can be made with large surface areas.

BRIEF DESCRIPTION OF THE DRAWINGS

The above and other features and advantages of the invention will be better understood upon reference to the accompanying drawing wherein.

DETAILED DESCRIPTION

Figure 1:
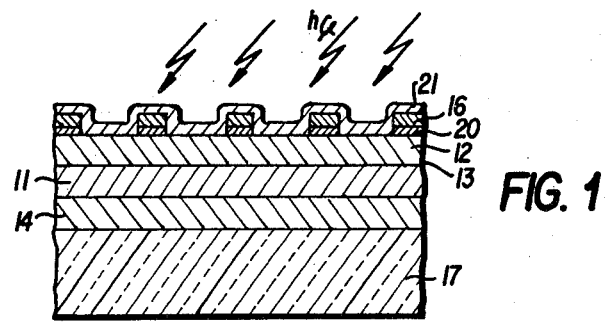
FIG. 1 is a schematic cross-sectional view (not to scale) of a thin film photovoltaic device incorporating the invention and
FIG. 2 is a diagrammatic illustration of the multitarget sputtering process for achieving large grain size in the CdSiAs$_2$ material.

As illustrated in FIG. 1, a radiant energy converter 10 for solar energy is constituted by a thin film CdSiAs$_2$ photovoltaic absorber layer 11 formed as a p-type semiconductor material, and a top thin film layer 12 of CdS deposited as an n-type semiconductor material to form a heterojunction 13. Anode 14 and cathode electrode 16 carry the photogenerated electrical current to a load device.

In the preferred embodiment a non-conductive support plate 17 formed of glass, ceramic or as a dielectric layer on a support or carrier member, has a layer of molybdenum metal 14, which constitutes the anode, deposited thereon. It will be appreciated that other conductive metals or alloys which do not react with the CdSiAs$_2$ thin film layer 11 may be used, either as foils adhered or deposited on the non-conductive support substrate, and, if themselves rigid enough, the non-conductive glass plate need not be used.

The cathode electrode 16 is constituted by a copper grid which is secured to the CdS collector layer 12 by a low temperature solder medium 20, such as indium or aluminum metal which are non-reactive with CdS, or at least do not adversely affect the function of the cathode electrode.

The cell as thus constructed is protected by a radiant energy transparent material such as a plastic encapsulant 21. The cell structure thus formed is of the back wall type but it will be appreciated that the large grain size absorber layer feature can be applied to other radiant energy conversion systems.

Figure 2:
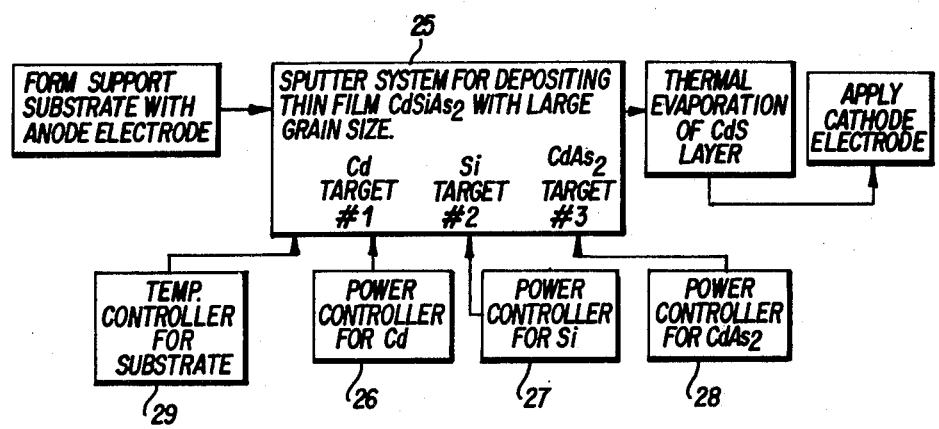

As diagrammatically illustrated in FIG. 2, the support substrate is initially prepared by depositing a thin (about 2 microns) layer of molybdenum metal 14 on a support plate, such as glass, ceramic, plastic or a rigid conductor which does not adversely affect the stoichiometry of the sputtered CdSiAs$_2$ layer and the achievement of large grain size. The conductive substrate 14, 17 is placed in the sputter system 25 for depositing the polycrystalline thin film CdSiAs$_2$ layer 11 with large grain size to reduce boundary layer recombination of photogenerated electrons and thereby improve the efficiency of solar energy conversion. The sputtering system 25 incorporates multiple targets, there being a separate target for Cd, Si and CdAs$_2$ with independent controllers 26, 27 and 28, respectively, for controlling the ambient temperature of the targets (from about 90° C. to about 100° C., respectively, sputter bias voltages of from about 0 volts to about 1000 volts and a control 29 for the ambient temperature of the substrate assembly 14, 17. In a specific embodiment, the CdSiAs$_2$ is from about 0.01 to about 0.001 micron thick and the molybdenum layer is about 2 micrometers thick. The parameters of the specific sputtering operation for the CdSiAs$_2$ layer are set forth in the following specific example:

EXAMPLE

An absorber layer was formed using a Perkin-Elmer Corporation Model Randex 2400-8SA multiple target sputtering machine with three separate 8 inch diameter cathodes and a substrate table 21½" long. The sputtering machine was provided with separate cadmium (Cd), silicon (Si) and cadmium arsenide (CdAs$_2$) targets which were sputtered under the following operating parameters:

Target bias at 1000 volts
Substrate bias at 0 volts
Base pressure $1.5 \times 10^{-7}$ torr (nitrogen)
Argon pressure 10 millitorr
Substrate temperature 225° C.±5° C. (This temperature gives the best crystals)
Forward power 110 watts (limits evaporation of arsenic)
Substrate power 0 watts The absorber layer formed was polycrystalline, having large grain sizes of 5 microns or larger.

While the invention has been described with respect to a specific embodiment, there are many adaptations and variations of the invention which come within the spirit and scope thereof as defined in the claims appended hereto.

What is claimed is:

1. In the manufacture of a radiant energy conversion cell the improvement comprising,
forming a polycrystalline layer with large grain size by stoichiometrically sputtering $CdSiAs_2$ on a substrate using separate targets respectively comprising Cd, Si, and $CdAs_2$, each said target having an ambient temperature of about 90° C. to about 100° C. with sputter bias voltages between about 0 to 1000 volts, said substrate having a closely controlled ambient temperature, the power for sputtering and temperature being limited to avoid evaporation of arsenic.

2. In a radiant energy converter including a thin film absorber layer formed as a p-type semiconductor material and a thin film collector layer of an n-type semiconductor material in contact with and forming a heterojunction with said absorber layer, and electrode means on the non-contacting surfaces of said layers, the improvement wherein said absorber layer is a polycrystalline material formed by a controlled sputtering process to have large grain size to reduce grain boundary recombinations of photogenerated electrons and wherein said absorber is stoichiometric $CdSiAs_2$.

3. The invention defined in claim 2 wherein said collector layer is CdS.

4. The invention defined in claim 2 wherein said CdS is formed in situ on said $CdSiAs_2$ layer.

5. The invention defined in claim 4 wherein said $CdSiAs_2$ layer is from about 0.01 to about 0.001 micrometer thick.

6. A thin film radiant energy conversion device comprising,
(a) a conductive substrate,
(b) a polycrystalline layer of $CdSiAs_2$, having one surface conductively contacting the surface of said conductive substrate and constituting a p-type semiconductor layer,
(c) a CdS layer constituting an n-type semiconductor formed in situ on the other surface of said polycrystalline layer,
(d) a radiant energy transparent conducting layer conductively secured to said CdS layer, and
(e) output conductor means connected to said conductive substrate and said radiant energy transparent conducting layer.

7. The invention defined in claim 6 wherein said CdS layer is formed in situ by thermal evaporation.

8. The invention defined in claim 6 wherein said radiant energy transparent layer is a copper grid, with indium solder means conductively securing said copper grid to said CdS layer.

9. The invention defined in claim 8 including a means for hermetically sealing said device from the ambient.

10. A method of making a thin film $CdSiAs_2$-CdS solar cell comprising,
(a) forming a conductive substrate,
(b) forming a polycrystalline layer with large grain size by stoichiometrically sputtering $CdSiAs_2$ on said substrate, using separate targets respectively comprising Cd, Si, and $CdAs_2$, each said target having an ambient temperature of about 90° C. to about 100° C., said substrate having an ambient temperature of about 225° C.$\pm$5° C., with sputter bias voltages between about 0 to about 1000 volts,
(c) in situ forming said CdS layer on the surface of said $CdSiAs_2$ layer, and
(d) applying an electrode to the said CdS layer.

11. The invention defined in claim 10 wherein said conductive substrate includes a layer of molybdenum upon which said $CdSiAs_2$ thin film is deposited.

12. The invention defined in claim 11 including the step of thermally evaporating said CdS layer upon said $CdSiAs_2$ layer.

13. The invention defined in claim 11 the step of applying an electrode to said CdS layer includes adhering a radiant energy transparent grid to said CdS layer by a non-reactive solder.

* * * * *